(12) United States Patent
Mozak

(10) Patent No.: US 9,583,176 B1
(45) Date of Patent: Feb. 28, 2017

(54) VARIABLE WEAK LEAKER VALUES DURING READ OPERATIONS

(71) Applicant: Intel Corporation, Santa Clara, CA (US)

(72) Inventor: Christopher P. Mozak, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/864,435

(22) Filed: Sep. 24, 2015

(51) Int. Cl.
*G11C 7/00* (2006.01)
*G11C 11/4096* (2006.01)
*G11C 11/4076* (2006.01)
*G11C 7/22* (2006.01)

(52) U.S. Cl.
CPC ...... *G11C 11/4096* (2013.01); *G11C 11/4076* (2013.01); *G11C 7/222* (2013.01)

(58) Field of Classification Search
None
See application file for complete search history.

(56) References Cited

U.S. PATENT DOCUMENTS

| | | | |
|---|---|---|---|
| 5,060,196 A * | 10/1991 | Pae | G11C 7/1048 365/189.05 |
| 2009/0006776 A1 | 1/2009 | Spry et al. | |
| 2009/0059642 A1* | 3/2009 | Ware | G11C 5/147 365/63 |
| 2016/0087630 A1* | 3/2016 | Park | H03K 19/0013 326/30 |

* cited by examiner

*Primary Examiner* — Son Dinh
*Assistant Examiner* — Uyen B Tran
(74) *Attorney, Agent, or Firm* — Jordan IP Law, LLC

(57) ABSTRACT

Systems, apparatuses and methods may provide for determining a status of an enable signal and selecting a leaker resistance from a plurality of leaker resistances based at least in part on the status of the enable signal. Additionally, the selected leaker resistance may be applied to a data strobe line of a memory bus. In one example, the selected leaker resistance reduces ringback noise on the data strobe line.

20 Claims, 3 Drawing Sheets

VARIABLE WEAK LEAKER VALUES DURING READ OPERATIONS

TECHNICAL FIELD

Embodiments generally relate to memory structures. More particularly, embodiments relate to the use of variable weak leaker values during read operations.

BACKGROUND

Conventional DRAM (dynamic random access memory) structures may generate a DQS (data strobe) signal that is used by a memory controller to maintain synchronization with the DRAM. Since the line carrying the DQS signal may float between transactions, noise and/or false transitions might be encountered when the DRAM is not actively driving. In order to qualify the state of the DQS signal, the memory controller may trigger a receive enable (RcvEn) signal after expiration of a calculated delay from a read command being sent to the DRAM, wherein the receive enable signal is frequently trained to precisely position itself relative to the rising edge of the DQS signal and the memory controller may ignore the DQS signal when the receive enable signal is deasserted.

While a "weak leaker" resistance may be applied to the line carrying the DQS signal in order to eliminate noise encountered when the DRAM is not actively driving, there remains considerable room for improvement. Other embodiments may use a weak leaker or weak resistor pulldown on a DQS_P (e.g., DQS positive signal in differential signaling) and/or a weak resistor pullup on a DQS_N (e.g., DQS negative signal in differential signaling) to keep DQS in the logical low state when the DRAM is not driving. Such a solution, which may be used in addition to or instead of the RcvEn qualification, may potentially provide a more deterministic DQS value that only toggles during actual read operations. In any case, there remains considerable room for improvement.

For example, back-to-back reads (e.g., from multiple ranks in the DRAM) may create significant ringback noise that calls for a relatively low weak leaker resistance value (i.e., a "strong" leaker) in order to sufficiently keep the DQS signal logical low despite the ringback noise. Such a strong leaker may create DQS duty cycle distortion, which may have a negative impact on read timing margins during normal operation (e.g., when the DRAM is actively driving the DQS signal). This impact of both ringback and duty cycle distortion may be even more pronounced in systems having longer trace lengths between the DRAM and the memory controller.

BRIEF DESCRIPTION OF THE DRAWINGS

The various advantages of the embodiments will become apparent to one skilled in the art by reading the following specification and appended claims, and by referencing the following drawings, in which:

DESCRIPTION OF EMBODIMENTS

Figure 1:
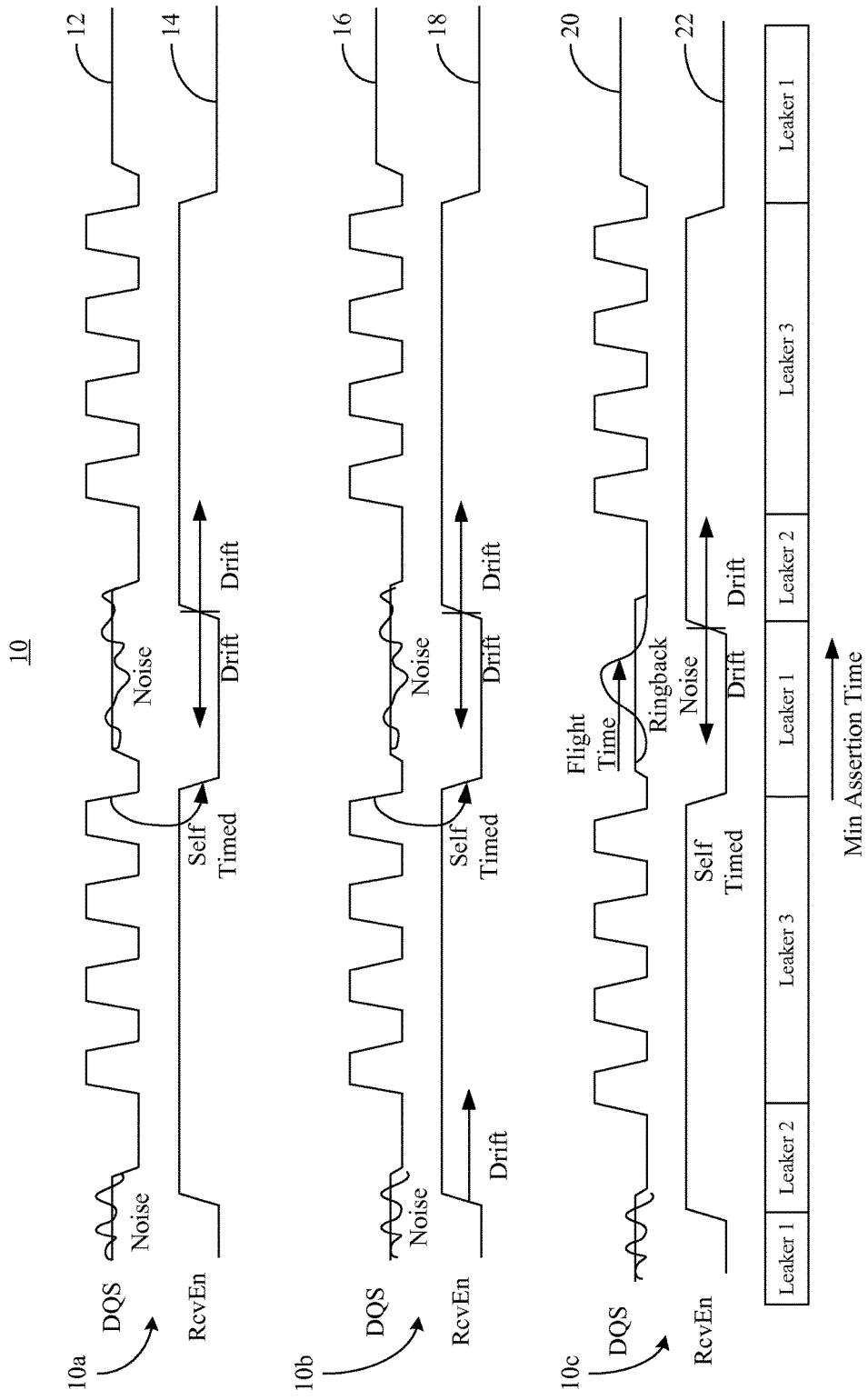
FIG. 1 is a set of timing diagrams of an example of a comparison between a conventional system having a single leaker resistance and a system having a plurality of leaker resistances according to an embodiment.

FIG. 1 shows a set of timing diagrams 10 (10a-10c) for different memory system configurations. More particularly, a first timing diagram 10a demonstrates that a memory system lacking a leaker resistance (e.g., noise suppression) may have a data strobe (DQS) signal 12 that is generated by a memory structure such as, for example, a dynamic random access memory (DRAM), wherein the DQS signal 12 includes active periods and inactive periods. During the inactive periods, the illustrated DQS signal 12 encounters noise. After sending each read command to the memory structure, a memory controller may wait for a self-timed period to expire before asserting an enable signal such as, for example, a receive enable (RcvEn) signal 14 that is used to qualify the state of the DQS signal 12. Thus, the memory controller may observe the DQS signal 12 only when the receive enable signal 14 is asserted (e.g., logical high). If the self-timed period expires while the line (e.g., trace) carrying the DQS signal 12 is still encountering noise (e.g., due to clock timing drift, tDQSCK), the noise may be incorrectly interpreted as the active portion of the DQS signal 12. The result may be synchronization errors that impact performance and/or power consumption. The synchronization errors may also cause functional failures by corrupting read data.

A second timing diagram 10b demonstrates that a memory system having only a single leaker resistance may have a DQS signal 16 that is generated by a memory structure, wherein the DQS signal 16 also includes active periods and inactive periods. During the inactive periods, the illustrated DQS signal 16 encounters noise. Applying a sufficiently strong leaker resistance to the line carrying the DQS signal 16, however, may reduce the amplitude of the noise to a level that reduces the likelihood of synchronization errors. As a result, looser timing and drift control for an enable signal such as, for example, a receive enable signal 18 might potentially be used. A relatively strong leaker resistance, on the other hand, may create duty cycle distortion during the active periods of the DQS signal 16. As already noted, the duty cycle distortion may in turn have a negative impact on read timing margins during normal operation, particularly in systems having longer trace lengths between the memory structure and the memory controller.

A third timing diagram 10c demonstrates that a memory system having a plurality of leaker resistance values may have a DQS signal 20 that is generated by a memory structure, wherein the DQS signal 20 includes active periods and inactive periods. During the inactive periods, the illustrated DQS signal 20 generally encounters noise. More particularly, the noise encountered may be due to ringback associated with back-to-back reads (e.g., a first read from a first bank in the memory structure, immediately followed by a second read from a second back in the memory structure).

The illustrated solution selects a first leaker resistance ("Leaker 1") in response to either a deassertion of an enable signal such as, for example, a receive enable signal 22 (e.g., or a transmit enable signal) or a fixed delay after deassertion of the receive enable signal 22 (e.g., or a transmit enable signal), wherein the first leaker resistance is strong enough to suppress the noise associated with the ringback. The first leaker resistance may be applied to the line carrying the DQS signal 20 in order suppress the ringback noise. Although the term "DQS" is used here, it should be understood that DQS may be differential and DQS_P/DQS_N (e.g., positive/negative signals) may either and/or both have weak leakers pulling the DQS_P/N in opposite directions.

Additionally, a second leaker resistance ("Leaker 2") may be selected in response to an expiration of a time period after application of the first leaker resistance to the data strobe line. The second leaker resistance may be applied to the line carrying the DQS signal 20, wherein the second leaker resistance may continue to suppress reflections and the time period is selected according to the round trip latency on the data strobe line (e.g., a function of ringback noise). As will be discussed in greater detail, the time period may generally be less than a read-to-read turnaround time associated with the data strobe line. Moreover, the time period may be adjustable based on an expected next read operation (e.g., one cycle gap, two cycle gap, etc.). The first leaker resistance may be less than the second leaker resistance.

The illustrated third timing diagram 10c also demonstrates that a third leaker resistance ("Leaker 3") may be selected in response to an assertion of the receive enable signal 22, wherein the third leaker resistance may be greater than the second leaker resistance. Thus, as the read operation draws closer in time, the leakers may become progressively weaker. The third leaker resistance may be applied to the line carrying the DQS signal 20. The second leaker resistance may generally ease the transition from a signal integrity, ringback, timing and duty cycle point of view. More particularly, the first rising edge in the DQS signal 20 may encounter a stronger leaker and slightly different timing than subsequent edges. As a result, the second leaker resistance may provide a suitable intermediate value. The approach demonstrated in the third timing diagram 10c may also be used with transmit enable signals that facilitate synchronization of write operations.

Additionally, a fourth leaker resistance value may be activated in response to the DQS signal starting to toggle. In such a case, the fourth leaker resistance may generally be greater than the third resistance value. As will be discussed in greater detail, the leaker resistance values may be controlled as discrete and/or continuous values.

Figure 2:
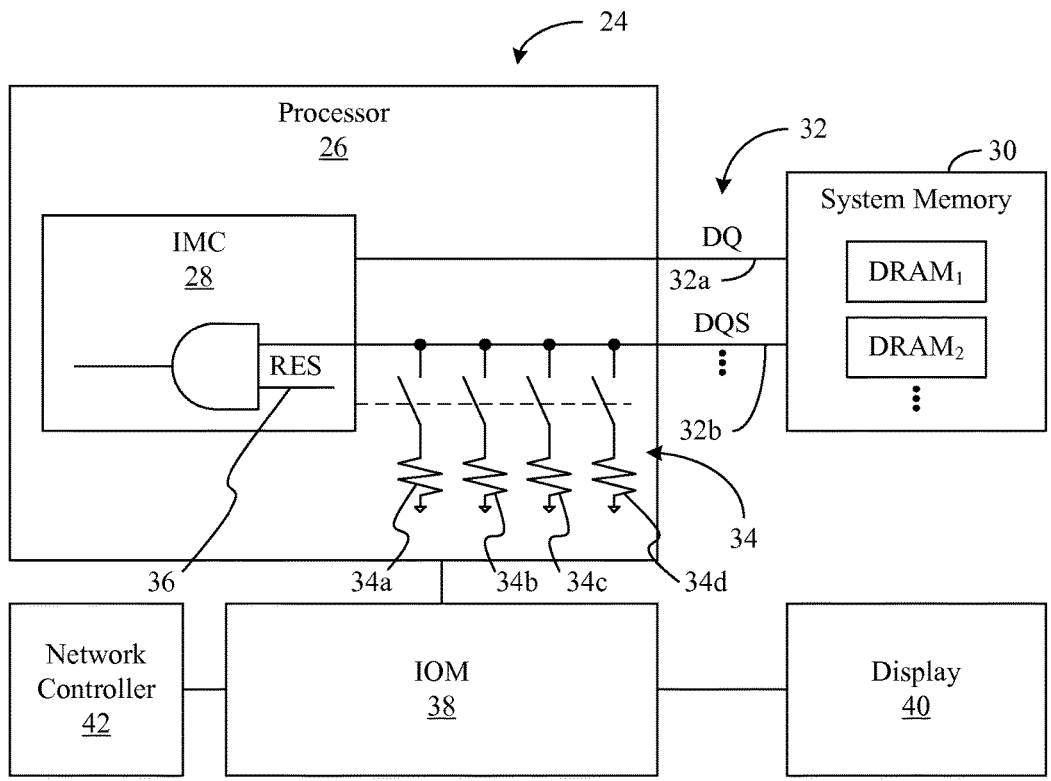
FIG. 2 is a block diagram of an example of a system having a plurality of leaker resistances according to an embodiment.

FIG. 2 shows a scalability-enhanced memory system 24. The memory system 24 may generally be part of an electronic device/platform having computing functionality (e.g., personal digital assistant/PDA, notebook computer, tablet computer, server), communications functionality (e.g., smart phone), imaging functionality, media playing functionality (e.g., smart television/TV), wearable functionality (e.g., watch, eyewear, headwear, footwear, jewelry), vehicular functionality (e.g., car, truck, motorcycle), etc., or any combination thereof. In the illustrated example, the system 24 a processor 26 having an integrated memory controller (IMC) 28, which may communicate with system memory 30 via a memory bus 32 (32a, 32b). The memory bus 32 may include one or more data lines 32a and one or more data strobe lines 32b (in addition to other lines such as, for example, a clock line, not shown). The system memory 30 may include, for example, dynamic RAM (DRAM) configured as one or more memory modules such as, for example, dual inline memory modules (DIMMs), small outline DIMMs (SODIMMs), etc. A memory subsystem as described herein may be compatible with a number of memory technologies, such as LPDDR3 (Low Power Double Data Rate version 3, original release by JEDEC (Joint Electronic Device Engineering Council) JESD209- 3B, August 2013 by JEDEC), LPDDR4 (Low Power Double Data Rate version 4, JESD209-4, originally published by JEDEC in August 2014), and so forth.

In the illustrated example, the processor 26 also includes a plurality of leaker resistances 34 (34a-34d) including, for example, a first leaker resistance 34a, a second leaker resistance 34b, a third leaker resistance 34c, a fourth leaker resistance 34d, and so forth. The IMC 28 may generally determine the status of an enable signal such as, for example, a receive enable signal ("RES") 36, select a leaker resistance from the plurality of leaker resistances 34 based at least in part on the status of the receive enable signal 36, and apply the selected leaker resistance to the data strobe line 32b. The selected leaker resistance may reduce ringback noise on the data strobe line(s) 32b.

For example, if the IMC 28 determines that the either the receive enable signal 36 (e.g., or transmit enable signal) has been deasserted or a fixed delay has expired after deassertion of the receive enable signal 36 (e.g., or transmit enable signal), the IMC 28 may select the first leaker resistance 34a and apply the first leaker resistance to the data strobe line(s) 32b. If, on the other hand, the IMC 28 detects an expiration of a time period after application of the first leaker resistance 34a to the data strobe line(s) 32b, the IMC 28 may select and apply the second leaker resistance 34b to the data strobe line(s) 32b. The first leaker resistance 34a may be less than the second leaker resistance 34b. The time period may generally be less than a read-to-read turnaround time associated with the data strobe line(s) 32b. The read-to-read turnaround time may be considered the minimum amount of time between conducting a read to a first memory rank (e.g., "$DRAM_1$") in the system memory 30 and a second memory rank (e.g., "$DRAM_2$") in the system memory 30. In one example, the time period is adjustable based on an expected next read operation. The time period may be implemented with a clock counter, a compensated (e.g., closed loop) delay, an uncompensated (e.g., open loop) delay, and so forth. Such an approach may enable tight turnaround times while still obviating ringback concerns.

The IMC 28 may also select and apply the third leaker resistance 34c to the data strobe line(s) 32b in response to an assertion of the receive enable signal 36, wherein the second leaker resistance 34b is less than the third leaker resistance 34c. The third leaker resistance 34c may even be off (e.g., infinite Ohms). In one example, a fourth leaker resistance 34d is selected and applied to the data strobe line(s) 32b in response to the DQS signal starting to toggle, wherein the third leaker resistance 34c is less than the fourth leaker resistance.

The values of the leaker resistances 34 may be programmable values stored to appropriate registers (not shown) in the system 24. Moreover, although the leaker resistances 34 are shown as discrete resistor values, other embodiments may slowly change the resistance in a more continuous fashion over a period of time in response to the same events. For example, the first leaker resistance 34a may slowly decay to the value of the second leaker resistance 34b or the third leaker resistance 34c over a period of time. This approach may have the advantage of not introducing noise in the transmission line from sudden resistance changes.

The registers containing the values of the leaker resistances 34 may be accessible through firmware such as, for example, BIOS (basic input/output system) or other processes/routines. BIOS may also train the strength or timing of the leaker based on running functional read and/or write traffic and observing the system's response. One possible way to observe and quantify the system's response would be to adjust the timing of the RES 36 and determine how much it may be moved before causing a failure. Another option would be to measure how much voltage offset may be added to the DQS receiver until a failure is created.

The tighter turnaround times enabled by the plurality of leaker resistances 34 may indeed render the illustrated memory system 24 more scalable in terms of frequency and/or performance. Indeed, the illustrated memory system 24 may be particularly useful in low power memory architectures such as, for example, handheld and/or wearable devices.

The processor 26 may also be coupled to an input/output module (IOM) 38, which may be integrated with the processor 26 onto a semiconductor die as a system on chip (SoC). The IOM 38 may in turn be coupled to a display 40 that visually outputs data handled by the processor 26 and/or IOM 38 and a network controller 42 that enables the system 24 communicate with remote devices (e.g., servers, routers, pier systems, etc.).

Figure 3:
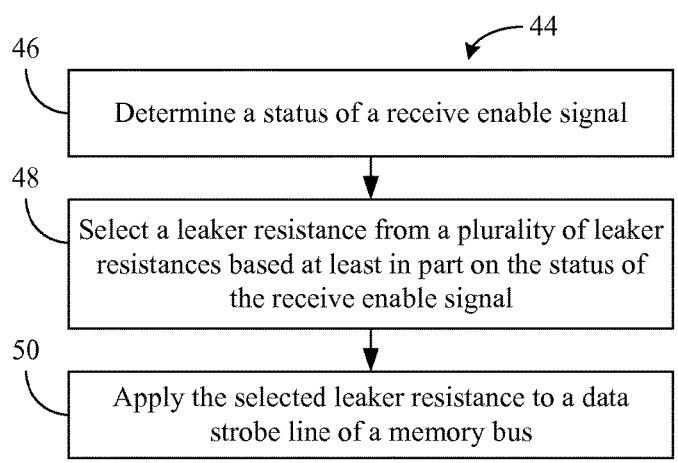
FIG. 3 is a flowchart of an example of a method of operating a memory controller apparatus according to an embodiment.

FIG. 3 shows a method 44 of operating a memory controller apparatus. The method 44 may generally be implemented in a memory controller apparatus such as, for example, the IMC 288 (FIG. 2) already discussed. More particularly, the method 44 may be implemented in one or more modules as a set of logic instructions stored in a machine- or computer-readable storage medium such as random access memory (RAM), read only memory (ROM), programmable ROM (PROM), firmware, flash memory, etc., in configurable logic such as, for example, programmable logic arrays (PLAs), field programmable gate arrays (FPGAs), complex programmable logic devices (CPLDs), in fixed-functionality logic hardware using circuit technology such as, for example, application specific integrated circuit (ASIC), complementary metal oxide semiconductor (CMOS) or transistor-transistor logic (TTL) technology, or any combination thereof. For example, computer program code to carry out operations shown in method 44 may be written in any combination of one or more programming languages, including an object oriented programming language such as JAVA, SMALLTALK, C++ or the like and conventional procedural programming languages, such as the "C" programming language or similar programming languages.

Illustrated processing block 46 may provide for determining a status of a receive enable signal, wherein a leaker resistance 48 may be selected from a plurality of leaker resistances based at least in part on the status of the receive enable signal. Additionally, illustrated block 50 applies the selected leaker resistance to a data strobe line of a memory bus. As already noted, the selected leaker may reduce ringback noise on the data strobe line. Block 50 may include applying a first leaker resistance to the data strobe line in response to either a deassertion of the receive enable signal or a fixed delay after the deassertion of the receive enable signal. Block 50 may also include applying a weaker second leaker resistance to the data strobe line in response to an expiration of a time period after application of the first leaker resistance to the data strobe line. Additionally, block 50 may include applying an even weaker third leaker resistance to the data strobe line in response to an assertion of the receive enable signal.

Figure 4:
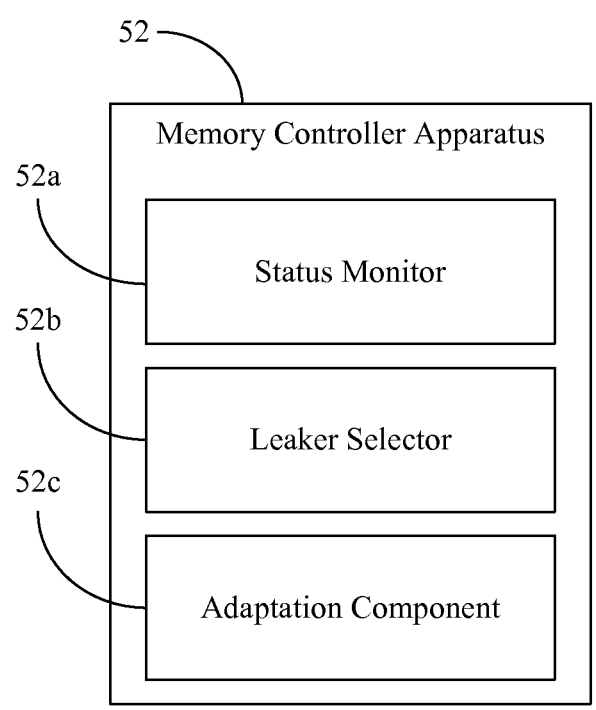
FIG. 4 is a block diagram of an example of a memory controller apparatus according to an embodiment.

FIG. 4 shows a memory controller apparatus 52 (52a-52c). The apparatus 52 may generally implement one or more aspects of the method 44 (FIG. 3) and may be readily substituted for the IMC 28 (FIG. 2). Thus, the apparatus 52 may be implemented as logic instructions, configurable logic, fixed-functionality logic hardware, etc., or any combination thereof. In the illustrated example, a status monitor determines a status of a receive enable signal. A leaker selector 52b may select a leaker resistance from a plurality of leaker resistances based on at least in part the status of the receive enable signal. The apparatus 52 may also include an adaptation component 52c that applies the selected leaker resistance to a data strobe line of a memory bus, wherein the selected leaker resistance is to reduce ringback noise on the data strobe line.

In one example, a first leaker resistance is selected and applied to the data strobe line in response to either a deassertion of the receive enable signal or a fixed delay after the deassertion of the receive enable signal. Additionally, a second leaker resistance may be selected and applied to the data strobe line in response to an expiration of a time period after application of the first leaker resistance to the data strobe line. Moreover, a third leaker resistance may be selected and applied to the data strobe line in response to an assertion of the receive enable signal. Additionally, a fourth leaker resistance may be selected and applied to the data strobe line in response to a data strobe signal on the data strobe line starting to toggle. The first leaker resistance may be less than the second leaker resistance, which may be less than the third leaker resistance. In addition, the third leaker resistance may be less than the fourth leaker resistance. The time period may be less than a read-to-read turnaround time associated with the data strobe line. The adaptation component 52c may also adjust the time period based on an expected next read operation.

Additional Notes and Examples

Example 1 may include scalability-enhanced memory system comprising a plurality of leaker resistances, a memory bus including a data strobe line, and a controller coupled to the memory bus and the plurality of leaker resistances, the controller including a status monitor to determine a status of a receive enable signal, a leaker selector to select leaker resistance from the plurality of leaker resistances based at least in part on the status of the receive enable signal, and an adaptation component to apply the selected leaker resistance to the data strobe line.

Example 2 may include the system of Example 1, wherein the plurality of leaker resistances includes a first leaker resistance, a second leaker resistance, a third leaker resistance and a fourth leaker resistance, wherein the first leaker resistance is to be selected and applied to the data strobe line in response to either a deassertion of the enable signal or a fixed delay after the deassertion of the enable signal, the second leaker resistance is to be selected and applied to the data strobe line in response to an expiration of a time period after application of the first leaker resistance to the data strobe line, the third leaker resistance is to be selected and applied to the data strobe line in response to an assertion of the enable signal, and the fourth leaker resistance is to be selected and applied to the data strobe line in response to a data strobe signal on the data strobe line starting to toggle.

Example 3 may include the system of Example 2, wherein the first leaker resistance is less than the second leaker resistance, wherein the second leaker resistance is less than the third leaker resistance, and wherein the third leaker resistance is less than the fourth leaker resistance.

Example 4 may include the system of Example 2, wherein the time period is less than a read-to-read turnaround time associated with the data strobe line.

Example 5 may include the system of Example 2, wherein the adaptation component is to adjust the time period based on an expected next read operation.

Example 6 may include the system of any one of Examples 1 to 5, wherein the selected leaker resistance is to reduce ringback noise on the data strobe line.

Example 7 may include a memory controller apparatus comprising a status monitor to determine a status of a receive enable signal, a leaker selector to select a leaker resistance from a plurality of leaker resistances based at least in part on the status of the receive enable signal, and an adaptation component to apply the selected leaker resistance to a data strobe line of a memory bus.

Example 8 may include the apparatus of Example 7, wherein a first leaker resistance is to be selected and applied to the data strobe line in response to either a deassertion of the enable signal or a fixed delay after the deassertion of the enable signal, a second leaker resistance is to be selected and applied to the data strobe line in response to an expiration of a time period after application of the first leaker resistance to the data strobe line, a third leaker resistance is to be selected and applied to the data strobe line in response to an assertion of the enable signal, and a fourth leaker resistance is to be selected and applied to the data strobe line in response to a data strobe signal on the data strobe line starting to toggle.

Example 9 may include the apparatus of Example 8, wherein the first leaker resistance is less than the second leaker resistance, wherein the second leaker resistance is less than the third leaker resistance, and wherein the third leaker resistance is less than the fourth leaker resistance.

Example 10 may include the apparatus of Example 8, wherein the time period is less than a read-to-read turnaround time associated with the data strobe line.

Example 11 may include the apparatus of Example 8, wherein the adaptation component is to adjust the time period based on an expected next read operation.

Example 12 may include the apparatus of any one of Examples 7 to 11, wherein the selected leaker resistance is to reduce ringback noise on the data strobe line.

Example 13 may include a method of operating a memory controller apparatus comprising determining a status of a receive enable signal, selecting a leaker resistance from a plurality of leaker resistances based at least in part on the status of the receive enable signal, and applying the selected leaker resistance to a data strobe line of a memory bus.

Example 14 may include the method of Example 13, wherein a first leaker resistance is selected and applied to the data strobe line in response to either a deassertion of the enable signal or a fixed delay after the deassertion of the enable signal, a second leaker resistance is selected and applied to the data strobe line in response to an expiration of a time period after application of the first leaker resistance to the data strobe line, a third leaker resistance is selected and applied to the data strobe line in response to an assertion of the enable signal, and a fourth leaker resistance is selected and applied to the data strobe line in response to a data strobe signal on the data strobe line starting to toggle.

Example 15 may include the method of Example 14, wherein the first leaker resistance is less than the second leaker resistance, wherein the second leaker resistance is less than the third leaker resistance, and wherein the third leaker resistance is less than the fourth leaker resistance.

Example 16 may include the method of Example 14, wherein the time period is less than a read-to-read turnaround time associated with the data strobe line.

Example 17 may include the method of Example 14, further including adjusting the time period based on an expected next read operation.

Example 18 may include the method of any one of Examples 13 to 17, wherein the selected leaker resistance reduces ringback noise on the data strobe line.

Example 19 may include a scalability-enhanced memory system comprising a display, a plurality of leaker resistances, a memory bus including a data strobe line, a memory coupled to the memory bus, and a controller coupled to the memory bus and the plurality of leaker resistances, the controller including a status monitor to determine a status of an enable signal, a leaker selector to select a leaker resistance from the plurality of leaker resistances based at least in part on the status of the enable signal, and an adaptation component to apply the selected leaker resistance to the data strobe line.

Example 20 may include the system of Example 19, wherein the plurality of leaker resistances includes a first leaker resistance, a second leaker resistance, a third leaker resistance and a fourth leaker resistance, wherein the first leaker resistance is to be selected and applied to the data strobe line in response to either a deassertion of the enable signal or a fixed delay after the deassertion of the enable signal, the second leaker resistance is to be selected and applied to the data strobe line in response to an expiration of a time period after application of the first leaker resistance to the data strobe line, the third leaker resistance is to be selected and applied to the data strobe line in response to an assertion of the enable signal, and the fourth leaker resistance is to be selected and applied to the data strobe line in response to a data strobe signal on the data strobe line starting to toggle.

Example 21 may include the system of Example 20, wherein the first leaker resistance is less than the second leaker resistance, wherein the second leaker resistance is less than the third leaker resistance, and wherein the third leaker resistance is less than the fourth leaker resistance.

Example 22 may include the system of Example 20, wherein the time period is less than a read-to-read turnaround time associated with the data strobe line.

Example 23 may include the system of Example 20, wherein the adaptation component is to adjust the time period based on an expected next read operation.

Example 24 may include the system of any one of Examples 1 to 5, wherein the memory includes a dynamic random access memory (DRAM).

Example 25 may include the system of Example 24, wherein the DRAM includes a low power double data rate (LPDDR) memory.

Example 26 may include a memory controller apparatus comprising means for determining a status of an enable signal, means for selecting a leaker resistance from a plurality of leaker resistances based at least in part on the status of the enable signal, and means for applying the selected leaker resistance to a data strobe line of a memory bus.

Example 27 may include the apparatus of Example 26, wherein a first leaker resistance is to be selected and applied to the data strobe line in response to either a deassertion of the enable signal or a fixed delay after the deassertion of the enable signal, a second leaker resistance is to be selected and applied to the data strobe line in response to an expiration of a time period after application of the first leaker resistance to the data strobe line, a third leaker resistance is to be selected and applied to the data strobe line in response to an assertion of the enable signal, and a fourth leaker resistance is to be selected and applied to the data strobe line in response to a data strobe signal on the data strobe line starting to toggle.

Example 28 may include the apparatus of Example 27, wherein the first leaker resistance is to be less than the second leaker resistance, wherein the second leaker resistance is to be less than the third leaker resistance, and wherein the third leaker resistance is less than the fourth leaker resistance.

Example 29 may include the apparatus of Example 27, wherein the time period is to be less than a read-to-read turnaround time associated with the data strobe line.

Example 30 may include the apparatus of Example 27, further including means for adjusting the time period based on an expected next read operation.

Example 31 may include the apparatus of any one of Examples 26 to 30, wherein the selected leaker resistance is to reduce ringback noise on the data strobe line.

Embodiments are applicable for use with all types of semiconductor integrated circuit ("IC") chips. Examples of these IC chips include but are not limited to processors, controllers, chipset components, programmable logic arrays (PLAs), memory chips, network chips, systems on chip (SoCs), SSD/NAND controller ASICs, and the like. In addition, in some of the drawings, signal conductor lines are represented with lines. Some may be different, to indicate more constituent signal paths, have a number label, to indicate a number of constituent signal paths, and/or have arrows at one or more ends, to indicate primary information flow direction. This, however, should not be construed in a limiting manner. Rather, such added detail may be used in connection with one or more exemplary embodiments to facilitate easier understanding of a circuit. Any represented signal lines, whether or not having additional information, may actually comprise one or more signals that may travel in multiple directions and may be implemented with any suitable type of signal scheme, e.g., digital or analog lines implemented with differential pairs, optical fiber lines, and/or single-ended lines.

Example sizes/models/values/ranges may have been given, although embodiments are not limited to the same. As manufacturing techniques (e.g., photolithography) mature over time, it is expected that devices of smaller size could be manufactured. In addition, well known power/ground connections to IC chips and other components may or may not be shown within the figures, for simplicity of illustration and discussion, and so as not to obscure certain aspects of the embodiments. Further, arrangements may be shown in block diagram form in order to avoid obscuring embodiments, and also in view of the fact that specifics with respect to implementation of such block diagram arrangements are highly dependent upon the platform within which the embodiment is to be implemented, i.e., such specifics should be well within purview of one skilled in the art. Where specific details (e.g., circuits) are set forth in order to describe example embodiments, it should be apparent to one skilled in the art that embodiments can be practiced without, or with variation of, these specific details. The description is thus to be regarded as illustrative instead of limiting.

The term "coupled" may be used herein to refer to any type of relationship, direct or indirect, between the components in question, and may apply to electrical, mechanical, fluid, optical, electromagnetic, electromechanical or other connections. In addition, the terms "first", "second", etc. may be used herein only to facilitate discussion, and carry no particular temporal or chronological significance unless otherwise indicated.

Those skilled in the art will appreciate from the foregoing description that the broad techniques of the embodiments can be implemented in a variety of forms. Therefore, while the embodiments have been described in connection with particular examples thereof, the true scope of the embodiments should not be so limited since other modifications will become apparent to the skilled practitioner upon a study of the drawings, specification, and following claims.

I claim:

1. A system comprising:
    a plurality of leaker resistances;
    a memory bus including a data strobe line; and
    a controller coupled to the memory bus and the plurality of leaker resistances, the controller including:
        a status monitor to determine a status of an enable signal,
        a leaker selector to select a leaker resistance from the plurality of leaker resistances based at least in part on the status of the enable signal, and
        an adaptation component to apply the selected leaker resistance to the data strobe line,
    wherein the plurality of leaker resistances includes a first leaker resistance, a second leaker resistance, a third leaker resistance and a fourth leaker resistance, and
    wherein the first leaker resistance is to be selected and applied to the data strobe line in response to either a deassertion of the enable signal or a fixed delay after the deassertion of the enable signal, the second leaker resistance is to be selected and applied to the data strobe line in response to an expiration of a time period after application of the first leaker resistance to the data strobe line, the third leaker resistance is to be selected and applied to the data strobe line in response to an assertion of the enable signal, and the fourth leaker resistance is to be selected and applied to the data strobe line in response to a data strobe signal on the data strobe line starting to toggle.

2. The system of claim 1, wherein the first leaker resistance is less than the second leaker resistance, wherein the second leaker resistance is less than the third leaker resistance, and wherein the third leaker resistance is less than the fourth leaker resistance.

3. The system of claim 1, wherein the time period is less than a read-to-read turnaround time associated with the data strobe line.

4. The system of claim 1, wherein the adaptation component is to adjust the time period based on an expected next read operation.

5. The system of claim 1, wherein the selected leaker resistance is to reduce ringback noise on the data strobe line.

6. An apparatus comprising:
    a status monitor to determine a status of an enable signal;
    a leaker selector to select a leaker resistance from a plurality of leaker resistances based at least in part on the status of the enable signal; and
    an adaptation component to apply the selected leaker resistance to a data strobe line of a memory bus,
    wherein a first leaker resistance is to be selected and applied to the data strobe line in response to either a deassertion of the enable signal or a fixed delay after the deassertion of the enable signal, a second leaker resistance is to be selected and applied to the data strobe line in response to an expiration of a time period after application of the first leaker resistance to the data strobe line, a third leaker resistance is to be selected and applied to the data strobe line in response to an assertion of the enable signal, and a fourth leaker resistance is to be selected and applied to the data strobe line in response to a data strobe signal on the data strobe line starting to toggle.

7. The apparatus of claim 6, wherein the first leaker resistance is less than the second leaker resistance, wherein the second leaker resistance is less than the third leaker resistance, and wherein the third leaker resistance is less than the fourth leaker resistance.

8. The apparatus of claim 6, wherein the time period is less than a read-to-read turnaround time associated with the data strobe line.

9. The apparatus of claim 6, wherein the adaptation component is to adjust the time period based on an expected next read operation.

10. The apparatus of claim 6, wherein the selected leaker resistance is to reduce ringback noise on the data strobe line.

11. A method comprising:
determining a status of an enable signal;
selecting a leaker resistance from a plurality of leaker resistances based at least in part on the status of the enable signal; and
applying the selected leaker resistance to a data strobe line of a memory bus,
wherein a first leaker resistance is selected and applied to the data strobe line in response to either a deassertion of the enable signal or a fixed delay after the deassertion of the enable signal, a second leaker resistance is selected and applied to the data strobe line in response to an expiration of a time period after application of the first leaker resistance to the data strobe line, a third leaker resistance is selected and applied to the data strobe line in response to an assertion of the enable signal, and a fourth leaker resistance is selected and applied to the data strobe line in response to a data strobe signal on the data strobe line starting to toggle.

12. The method of claim 11, wherein the first leaker resistance is less than the second leaker resistance, wherein the second leaker resistance is less than the third leaker resistance, and wherein the third leaker resistance is less than the fourth leaker resistance.

13. The method of claim 11, wherein the time period is less than a read-to-read turnaround time associated with the data strobe line.

14. The method of claim 11, further including adjusting the time period based on an expected next read operation.

15. The method of claim 11, wherein the selected leaker resistance reduces ringback noise on the data strobe line.

16. At least one non-transitory computer readable storage medium comprising a set of instructions, which when executed by a computing device, cause the computing device to:
determine a status of an enable signal;
select a leaker resistance from a plurality of leaker resistances based at least in part on the status of the enable signal; and
apply the selected leaker resistance to a data strobe line of a memory bus,
wherein a first leaker resistance is to be selected and applied to the data strobe line in response to either a deassertion of the enable signal or a fixed delay after the deassertion of the enable signal, a second leaker resistance is to be selected and applied to the data strobe line in response to an expiration of a time period after application of the first leaker resistance to the data strobe line, a third leaker resistance is to be selected and applied to the data strobe line in response to an assertion of the enable signal, and a fourth leaker resistance is to be selected and applied to the data strobe line in response to a data strobe signal on the data strobe line starting to toggle.

17. The at least one non-transitory computer readable storage medium of claim 16, wherein the first leaker resistance is less than the second leaker resistance, wherein the second leaker resistance is less than the third leaker resistance, and wherein the third leaker resistance is less than the fourth leaker resistance.

18. The at least one non-transitory computer readable storage medium of claim 16, wherein the time period is less than a read-to-read turnaround time associated with the data strobe line.

19. The at least one non-transitory computer readable storage medium of claim 16, wherein the instructions, when executed, cause a computing device to adjust the time period based on an expected next read operation.

20. The at least one non-transitory computer readable storage medium of claim 16, wherein the selected leaker resistance is to reduce ringback noise on the data strobe line.

* * * * *